United States Patent
Hsu et al.

(10) Patent No.: US 11,158,533 B2
(45) Date of Patent: Oct. 26, 2021

(54) SEMICONDUCTOR STRUCTURES AND FABRICATION METHOD THEREOF

(71) Applicant: Vanguard International Semiconductor Corporation, Hsinchu (TW)

(72) Inventors: Ching-Yi Hsu, Hsinchu (TW); Pi-Kuang Chuang, Hsinchu (TW); Po-Sheng Hu, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 102 days.

(21) Appl. No.: 16/182,834

(22) Filed: Nov. 7, 2018

(65) Prior Publication Data

US 2020/0144101 A1 May 7, 2020

(51) Int. Cl.
*H01L 21/70* (2006.01)
*H01L 21/762* (2006.01)
*H01L 29/06* (2006.01)
*H01L 27/092* (2006.01)

(52) U.S. Cl.
CPC .. *H01L 21/76229* (2013.01); *H01L 21/76235* (2013.01); *H01L 29/0649* (2013.01); *H01L 27/0922* (2013.01)

(58) Field of Classification Search
CPC ......... H01L 21/76229; H01L 21/76235; H01L 27/0922; H01L 29/0649; H01L 21/76232
USPC ................................. 257/506–511
See application file for complete search history.

(56) References Cited

U.S. PATENT DOCUMENTS

| | | | |
|---|---|---|---|
| 2004/0056293 A1* | 3/2004 | Saito | H01L 27/11526 257/296 |
| 2007/0066030 A1 | 3/2007 | Kim | |
| 2008/0057644 A1* | 3/2008 | Kwak | H01L 27/11568 438/257 |
| 2009/0302413 A1 | 12/2009 | Kang | |

(Continued)

FOREIGN PATENT DOCUMENTS

| | | |
|---|---|---|
| CN | 102282666 A | 12/2011 |
| CN | 102916024 A | 2/2013 |

(Continued)

OTHER PUBLICATIONS

Taiwanese Office Action and Search Report from TIPO for Application No. 107111231, dated Sep. 28, 2018.

*Primary Examiner* — Meiya Li
(74) *Attorney, Agent, or Firm* — Birch, Stewart, Kolasch & Birch, LLP

(57) ABSTRACT

A semiconductor structure is provided. The semiconductor structure includes a substrate, a first trench, and a second trench. The substrate has a first region and a second region. The first trench is formed in the substrate within the first region. The first trench is surrounded by a first protrusion structure having a top portion and sidewalls. The second trench is formed in the substrate within the second region. The second trench is surrounded by a second protrusion structure having a top portion and sidewalls. The second trench is deeper than the first trench. The connection portion between the top portion and the sidewalls of the second protrusion structure has a greater radius of curvature than the connection portion between the top portion and the sidewalls of the first protrusion structure.

17 Claims, 6 Drawing Sheets

(56) References Cited

U.S. PATENT DOCUMENTS

| | | | |
|---|---|---|---|
| 2013/0015534 A1* | 1/2013 | Cheng | H01L 21/845 257/401 |
| 2013/0175611 A1* | 7/2013 | Shinohara | H01L 21/823821 257/334 |
| 2015/0132919 A1 | 5/2015 | Chang et al. | |

FOREIGN PATENT DOCUMENTS

| | | |
|---|---|---|
| CN | 103227144 A | 7/2013 |
| CN | 105161450 A | 12/2015 |
| CN | 107811122 A | 1/2018 |
| TW | 200529353 A | 9/2005 |
| TW | 201118944 A1 | 6/2011 |
| TW | 201349310 A | 12/2013 |
| TW | 201726316 A | 8/2017 |
| TW | 201735178 A | 10/2017 |
| TW | 201735260 A | 10/2017 |
| TW | 201807776 A | 3/2018 |

\* cited by examiner

SEMICONDUCTOR STRUCTURES AND FABRICATION METHOD THEREOF

TECHNICAL FIELD

The technical field relates to a semiconductor structure with silicon nitride layers having different thicknesses in a low-voltage region and a high-voltage region respectively, and a method for fabricating the same.

BACKGROUND

For a high-voltage device, it is necessary to fabricate deep trenches to effectively increase the breakdown voltage thereof. However, for a low-voltage device, since the junction of the low-voltage device is shallow, if the trenches are deep at this time, during the subsequent implantation process, it will inevitably implant the substrate at its deeper position. However, the process conditions for such a deep implantation are not easy to control. In addition, since the filling process of the deep trenches is not easy to perform, the openings of the trenches between the low-voltage devices must be enlarged further. Thus, the above conditions show that a single-depth trench structure does not meet the requirements of the integration processes of high-voltage and low-voltage devices. However, the current methods used to fabricate trenches with different depths in the industry must be completed with multiple processing steps (ex. multiple photolithography and etching processes), which are very costly.

Therefore, development of a simple semiconductor structure with trenches having different depths respectively formed in its low-voltage region and high-voltage region and a related fabrication method is desirable.

SUMMARY

In accordance with one embodiment of the invention, a semiconductor structure is provided. The semiconductor structure comprises a substrate, a first trench and a second trench. The substrate comprises a first region and a second region. The first trench is formed in the substrate within the first region. The first trench is surrounded by a first protrusion structure which has a top portion and sidewalls. The second trench is formed in the substrate within the second region. The second trench is surrounded by a second protrusion structure which has a top portion and sidewalls. The second trench is deeper than the first trench. The connection portion between the top portion and the sidewalls of the second protrusion structure has a greater radius of curvature than the connection portion between the top portion and the sidewalls of the first protrusion structure.

In accordance with some embodiments, the substrate is represented as a silicon substrate.

In accordance with some embodiments, the first region is a region for disposition of a low-voltage device. The second region is a region for disposition of a high-voltage device.

In accordance with some embodiments, the first trench is an electrical isolation structure between the low-voltage devices. The second trench is an electrical isolation structure between the high-voltage devices.

In accordance with some embodiments, the distinction between the depths of the first and second trenches is in a range from 500 Å to 5,000 Å.

In accordance with some embodiments, the semiconductor structure further comprises a first silicon oxide layer formed on the top portion of the first protrusion structure.

In accordance with some embodiments, the semiconductor structure further comprises a second silicon oxide layer formed on the top portion of the second protrusion structure.

In accordance with some embodiments, the semiconductor structure further comprises a first dielectric layer formed on the first silicon oxide layer.

In accordance with some embodiments, the semiconductor structure further comprises a second dielectric layer formed on the second silicon oxide layer.

In accordance with some embodiments, the first dielectric layer has a greater thickness than the second dielectric layer.

In accordance with some embodiments, the first and second dielectric layers comprise silicon nitride or silicon oxide.

In accordance with some embodiments, the first silicon oxide layer further extends to cover a portion of the sidewalls of the first protrusion structure when the first dielectric layer is silicon nitride.

In accordance with some embodiments, the second silicon oxide layer further extends to cover a portion of the sidewalls of the second protrusion structure when the second dielectric layer is silicon nitride.

In accordance with some embodiments, the distinction between the thicknesses of the first and second dielectric layers is in a range from 300 Å to 1,000 Å.

In accordance with one embodiment of the invention, a method for fabricating a semiconductor structure is provided. The fabrication method comprises the following steps. A substrate comprising a first region and a second region is provided. A silicon oxide layer is formed on the substrate. A dielectric layer is formed on the silicon oxide layer. The dielectric layer within the first region of the substrate has a greater thickness than the dielectric layer within the second region of the substrate. An etching process is performed on the dielectric layer, the silicon oxide layer and the substrate to form a first trench within the first region of the substrate and to form a second trench within the second region of the substrate. The first trench is surrounded by a first protrusion structure which has a top portion and sidewalls. A second trench is surrounded by a second protrusion structure which has a top portion and sidewalls. The second trench is deeper than the first trench. The silicon oxide layer on the top portion of the first protrusion structure is defined as a first silicon oxide layer. The silicon oxide layer on the top portion of the second protrusion structure is defined as a second silicon oxide layer.

In accordance with some embodiments, the distinction between the thickness of the dielectric layer within the first region of the substrate and that of the dielectric layer within the second region of the substrate is in a range from 300 Å to 1,000 Å.

In accordance with some embodiments, the etching process has an etching gas comprising a combination of sulfur hexafluoride, methane and nitrogen, or a combination of sulfur hexafluoride, methane, nitrogen and oxygen.

In accordance with some embodiments, the dielectric layer and the substrate have an etching selectivity ratio which is in a range from 1:4 to 1:10.

In accordance with some embodiments, the dielectric layer comprises silicon nitride or silicon oxide.

In accordance with some embodiments, the fabrication method further comprises performing an oxidation process to extend the first silicon oxide layer to cover a portion of the sidewalls of the first protrusion structure, and to extend the second silicon oxide layer to cover a portion of the sidewalls of the second protrusion structure when the dielectric layer is silicon nitride.

In accordance with some embodiments, the connection portion between the top portion and the sidewalls of the second protrusion structure has a greater radius of curvature than the connection portion between the top portion and the sidewalls of the first protrusion structure.

In the present invention, the silicon nitride layers having different thicknesses are fabricated, respectively, within the low-voltage region and the high-voltage region (i.e. the thick silicon nitride layer is formed within the low-voltage region and the thin silicon nitride layer is formed within the high-voltage region). The single etching step with the specific etching conditions (such as the specific etching selectivity ratio of the silicon nitride layer to the silicon substrate) is then performed to simultaneously obtain the shallow trench in the low-voltage region and the deep trench in the high-voltage region.

In addition, during the subsequent oxidation process (which can be performed before or after the chemical mechanical polishing (CMP) process), since the silicon nitride layer in the low-voltage region is thicker and the silicon nitride layer in the high-voltage region is thinner, the rounding effect of the trench in the low-voltage region is less, and the trench in the high-voltage region shows more rounding effects. This different degree of the rounding effect has different contributions to low-voltage devices and high-voltage devices, respectively. For the low-voltage devices, less rounding effect maintains the effective width of the device channel, resulting in a high saturation-region drain current (Idsat). For the high-voltage devices, more rounding effects improve the uniformity of the related structure in the whole wafer and increase the device matching.

Therefore, the present invention reveals that the trenches of different depths can be fabricated in the low-voltage region and the high-voltage region, while at the same time improving the structural and electrical advantages of the low-voltage devices and the high-voltage devices.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
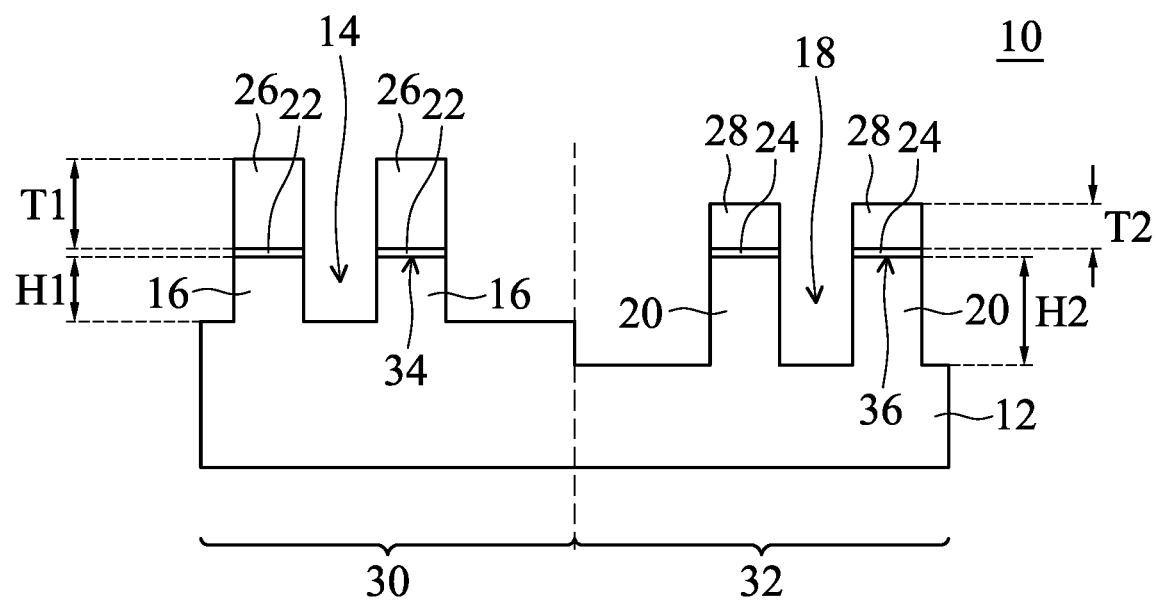
FIG. 1 is a cross-sectional view of a semiconductor structure in accordance with one embodiment of the invention.

Referring to FIG. 1, in accordance with one embodiment of the invention, a semiconductor structure 10 is provided. FIG. 1 is a cross-sectional view of the semiconductor structure 10.

As shown in FIG. 1, in this embodiment, the semiconductor structure 10 comprises a substrate 12, a first trench 14, a first protrusion structure 16, a second trench 18, a second protrusion structure 20, a first silicon oxide layer 22, a second silicon oxide layer 24, a first dielectric layer 26 and a second dielectric layer 28. The substrate 12 comprises a first region 30 and a second region 32. The first trench 14 is formed in the substrate 12 within the first region 30. The first trench 14 is surrounded by a first protrusion structure 16. The second trench 18 is formed in the substrate 12 within the second region 32. The second trench 18 is surrounded by a second protrusion structure 20. Specifically, the depth H2 of the second trench 18 is larger than the depth H1 of the first trench 14. The first silicon oxide layer 22 is formed on the top portion 34 of the first protrusion structure 16. The second silicon oxide layer 24 is formed on the top portion 36 of the second protrusion structure 20. The first dielectric layer 26 is formed on the first silicon oxide layer 22. The second dielectric layer 28 is formed on the second silicon oxide layer 24. Specifically, the thickness T1 of the first dielectric layer 26 is larger than the thickness T2 of the second dielectric layer 28.

In accordance with some embodiments, the substrate 12 may be a silicon substrate.

In accordance with some embodiments, the first region 30 may be a region for disposition of a low-voltage device. The second region 32 may be a region for disposition of a high-voltage device.

In accordance with some embodiments, the first trench 14 may be an electrical isolation structure between the low-voltage devices. The second trench 18 may be an electrical isolation structure between the high-voltage devices.

In accordance with some embodiments, the distinction between the depth H1 of the first trench 14 and the depth H2 of the second trench 18 is in a range from about 500 Å to about 5,000 Å.

In accordance with some embodiments, the first dielectric layer 26 and the second dielectric layer 28 may comprise silicon nitride or silicon oxide.

In this embodiment, the first dielectric layer 26 and the second dielectric layer 28 is silicon oxide.

In accordance with some embodiments, the distinction between the thickness T1 of the first dielectric layer 26 and the thickness T2 of the second dielectric layer 28 is in a range from about 300 Å to about 1,000 Å.

Referring to FIGS. 2A-2E, in accordance with one embodiment of the invention, a method for fabricating a semiconductor structure 10 is provided. FIGS. 2A-2E are cross-sectional views of the method for fabricating the semiconductor structure 10.

Figure 2A:
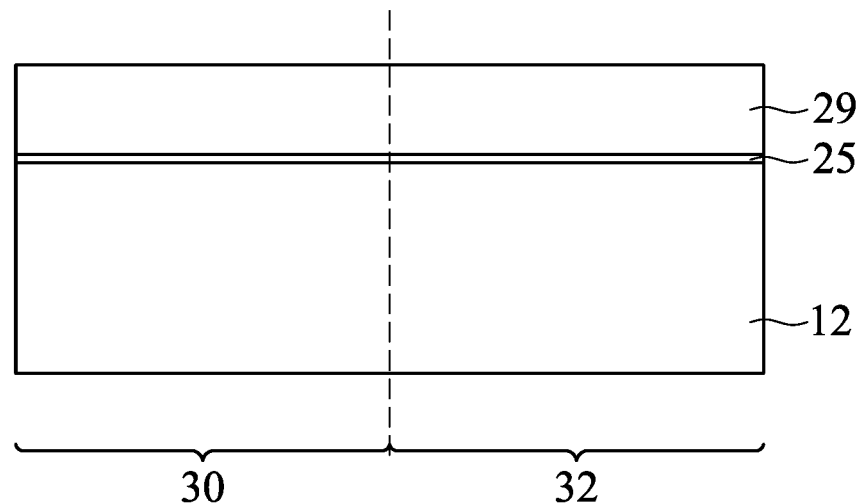
FIGS. 2A-2E are cross-sectional views of a method for fabricating a semiconductor structure in accordance with one embodiment of the invention.

As shown in FIG. 2A, a substrate 12 is provided. The substrate 12 comprises a first region 30 and a second region 32.

In accordance with some embodiments, the substrate 12 may be a silicon substrate.

In accordance with some embodiments, the first region 30 may be a region for disposition of a low-voltage device. The second region 32 may be a region for disposition of a high-voltage device.

Next, a silicon oxide layer 25 is formed on the substrate 12.

Next, a dielectric layer 29 is formed on the silicon oxide layer 25.

In accordance with some embodiments, the dielectric layer 29 may comprise silicon nitride or silicon oxide.

In this embodiment, the dielectric layer 29 is silicon oxide.

Figure 2B:
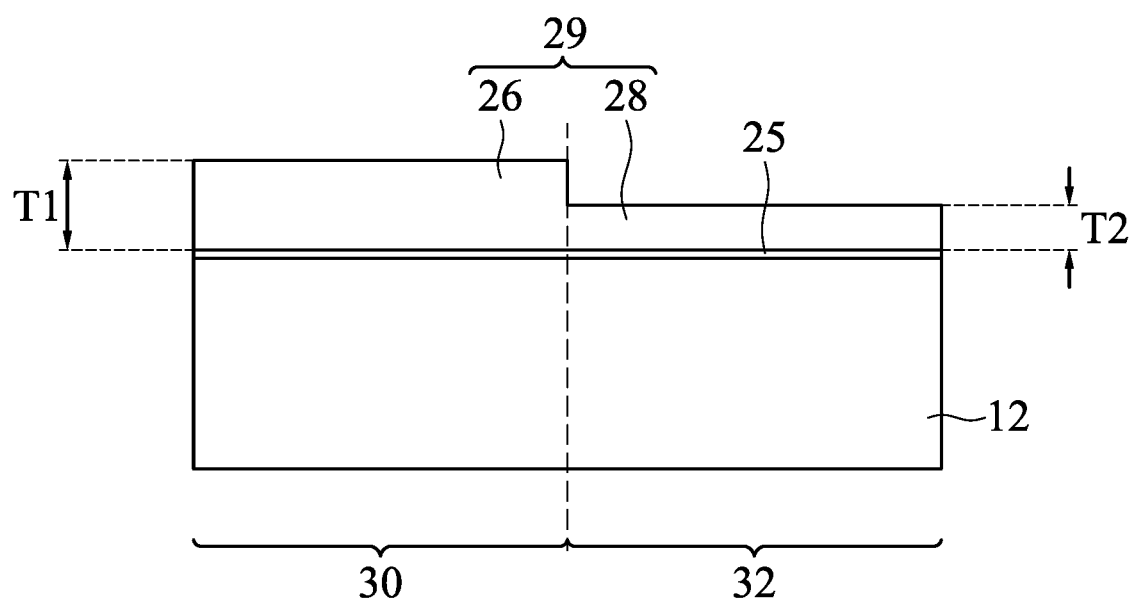

Next, the dielectric layer 29 is patterned to form a first dielectric layer 26 located within the first region 30 of the substrate 12 and a second dielectric layer 28 located within the second region 32 of the substrate 12. Specifically, the thickness T1 of the first dielectric layer 26 is larger than the thickness T2 of the second dielectric layer 28, as shown in FIG. 2B.

In accordance with some embodiments, the distinction between the thickness T1 of the first dielectric layer 26 and the thickness T2 of the second dielectric layer 28 is in a range from about 300 Å to about 1,000 Å.

Figure 2C:
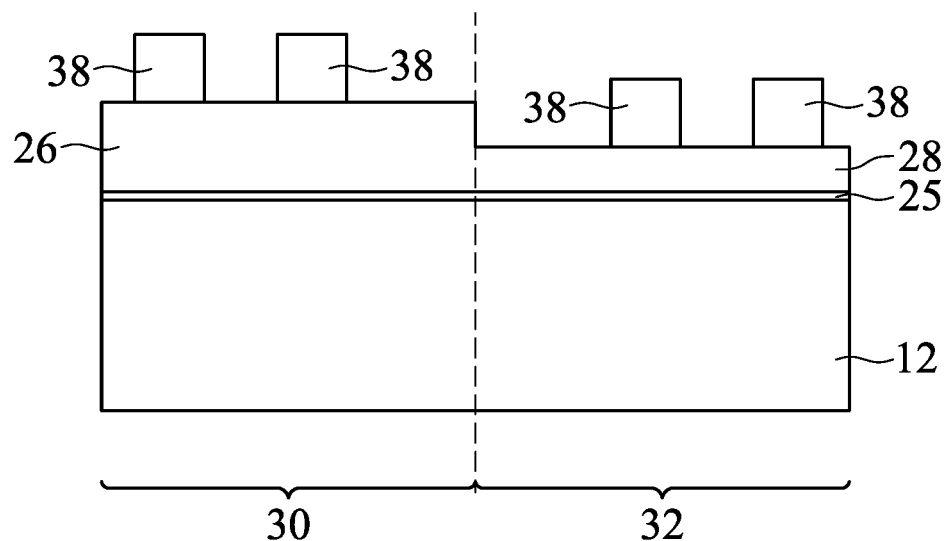

Next, a patterned photoresist layer 38 is formed on the first dielectric layer 26 and the second dielectric layer 28, as shown in FIG. 2C.

Figure 2D:
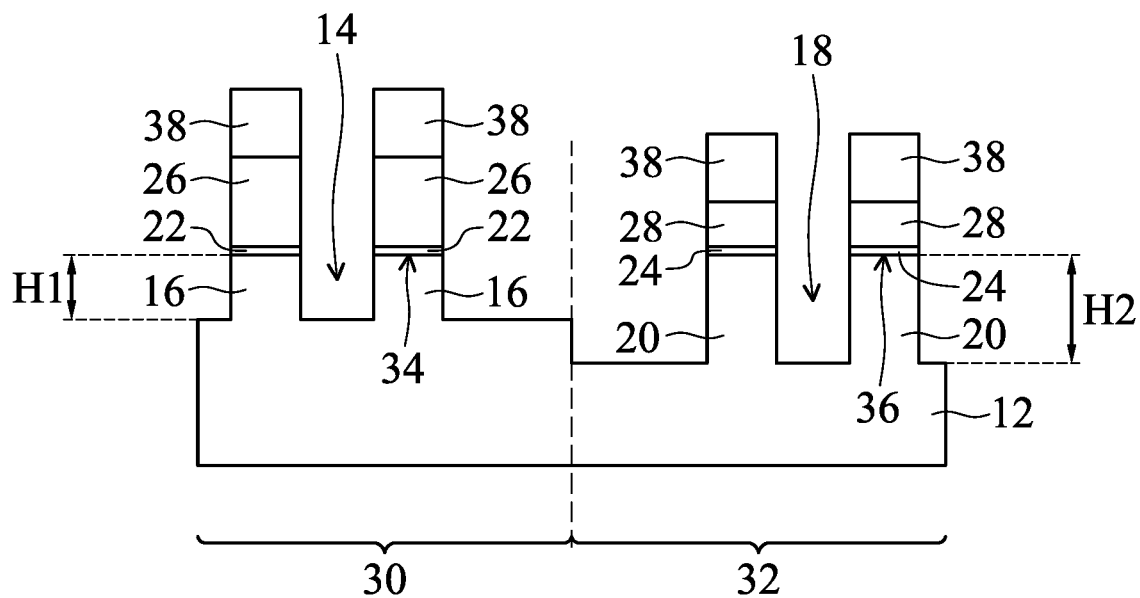

Next, an etching process is performed on the first dielectric layer 26, the second dielectric layer 28, the silicon oxide layer 25 and the substrate 12 using the patterned photoresist layer 38 as a mask to form a first trench 14 within the first region 30 of the substrate 12 and to form a second trench 18 within the second region 32 of the substrate 12. The first trench 14 is surrounded by a first protrusion structure 16. The second trench 18 is surrounded by a second protrusion structure 20. Specifically, the depth H2 of the second trench 18 is larger than the depth H1 of the first trench 14. The silicon oxide layer on the top portion 34 of the first protrusion structure 16 is defined as a first silicon oxide layer 22. The silicon oxide layer on the top portion 36 of the second protrusion structure 20 is defined as a second silicon oxide layer 24, as shown in FIG. 2D.

In accordance with some embodiments, etching gases used in the etching process may comprise a combination of sulfur hexafluoride, methane and nitrogen, or a combination of sulfur hexafluoride, methane, nitrogen and oxygen.

In accordance with some embodiments, etching selectivity ratios of the first dielectric layer 26 and the second dielectric layer 28 to the substrate 12 are in a range from about 1:4 to about 1:10.

In accordance with some embodiments, the first trench 14 may be an electrical isolation structure between low-voltage devices. The second trench 18 may be an electrical isolation structure between high-voltage devices.

In accordance with some embodiments, the distinction between the depth H1 of the first trench 14 and the depth H2 of the second trench 18 is in a range from about 500 Å to about 5,000 Å.

Figure 2E:
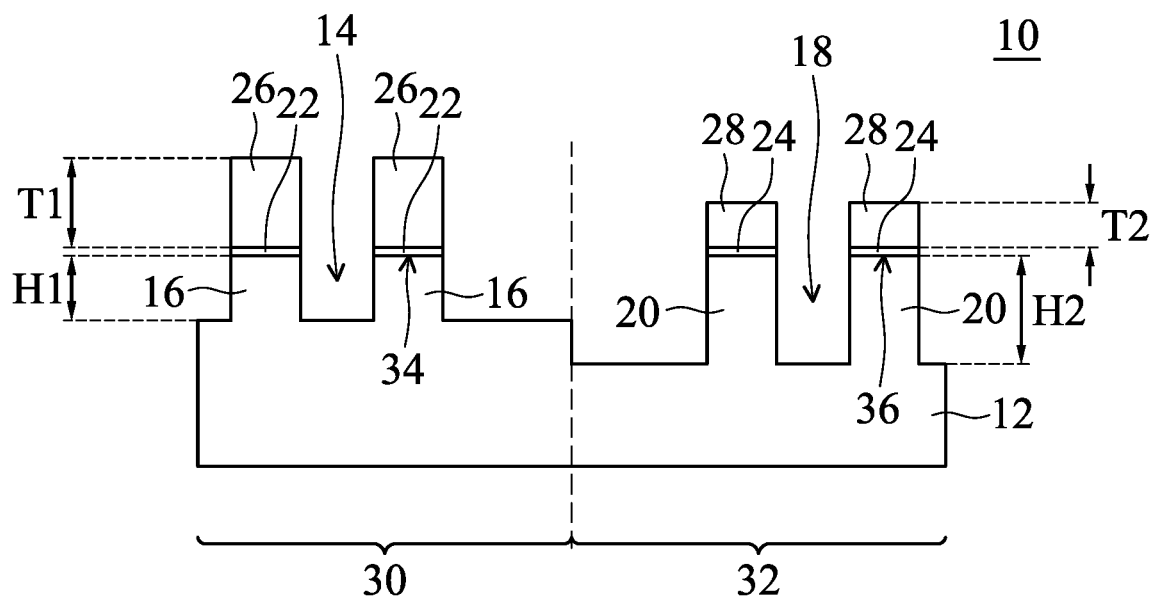

Next, the patterned photoresist layer 38 is removed, as shown in FIG. 2E. Therefore, the fabrication of the semiconductor structure 10 of this embodiment is completed.

Figure 3:
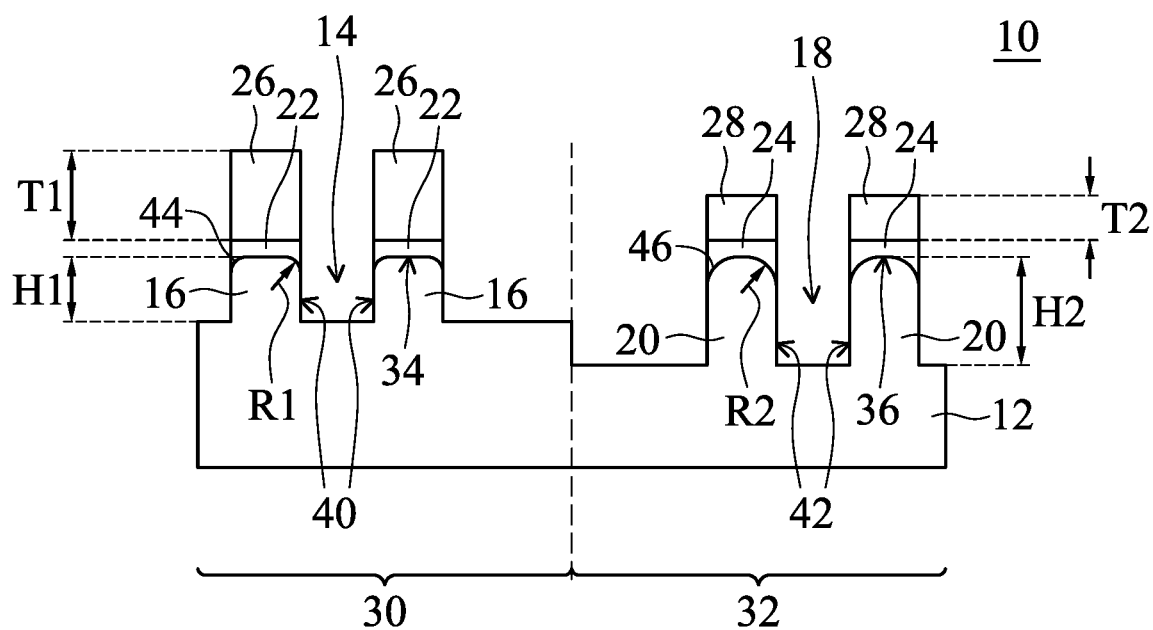
FIG. 3 is a cross-sectional view of a semiconductor structure in accordance with one embodiment of the invention.

Referring to FIG. 3, in accordance with one embodiment of the invention, a semiconductor structure 10 is provided. FIG. 3 is a cross-sectional view of the semiconductor structure 10.

As shown in FIG. 3, in this embodiment, the semiconductor structure 10 comprises a substrate 12, a first trench 14, a first protrusion structure 16, a second trench 18, a second protrusion structure 20, a first silicon oxide layer 22, a second silicon oxide layer 24, a first dielectric layer 26 and a second dielectric layer 28. The substrate 12 comprises a first region 30 and a second region 32. The first trench 14 is formed in the substrate 12 within the first region 30. The first trench 14 is surrounded by a first protrusion structure 16. The second trench 18 is formed in the substrate 12 within the second region 32. The second trench 18 is surrounded by a second protrusion structure 20. Specifically, the depth H2 of the second trench 18 is larger than the depth H1 of the first trench 14. The first silicon oxide layer 22 is formed on the top portion 34 of the first protrusion structure 16. The second silicon oxide layer 24 is formed on the top portion 36 of the second protrusion structure 20. The first dielectric layer 26 is formed on the first silicon oxide layer 22. The second dielectric layer 28 is formed on the second silicon oxide layer 24. Specifically, the thickness T1 of the first dielectric layer 26 is larger than the thickness T2 of the second dielectric layer 28.

In accordance with some embodiments, the substrate 12 may be a silicon substrate.

In accordance with some embodiments, the first region 30 may be a region for disposition of a low-voltage device. The second region 32 may be a region for disposition of a high-voltage device.

In accordance with some embodiments, the first trench 14 may be an electrical isolation structure between the low-voltage devices. The second trench 18 may be an electrical isolation structure between the high-voltage devices.

In accordance with some embodiments, the distinction between the depth H1 of the first trench 14 and the depth H2 of the second trench 18 is in a range from about 500 Å to about 5,000 Å.

In accordance with some embodiments, the first dielectric layer 26 and the second dielectric layer 28 may comprise silicon nitride or silicon oxide.

In this embodiment, the first dielectric layer 26 and the second dielectric layer 28 is silicon nitride.

In this embodiment, the first silicon oxide layer 22 further extends to cover a portion of the sidewalls 40 of the first protrusion structure 16. The second silicon oxide layer 24 further extends to cover a portion of the sidewalls 42 of the second protrusion structure 20. Specifically, the radius of curvature R2 of the connection portion 46 between the top portion 36 and the sidewalls 42 of the second protrusion structure 20 is larger than the radius of curvature R1 of the connection portion 44 between the top portion 34 and the sidewalls 40 of the first protrusion structure 16.

In accordance with some embodiments, the distinction between the thickness T1 of the first dielectric layer 26 and the thickness T2 of the second dielectric layer 28 is in a range from about 300 Å to about 1,000 Å.

Referring to FIGS. 4A-4E, in accordance with one embodiment of the invention, a method for fabricating a semiconductor structure 10 is provided. FIGS. 4A-4E are cross-sectional views of the method for fabricating the semiconductor structure 10.

Figure 4A:
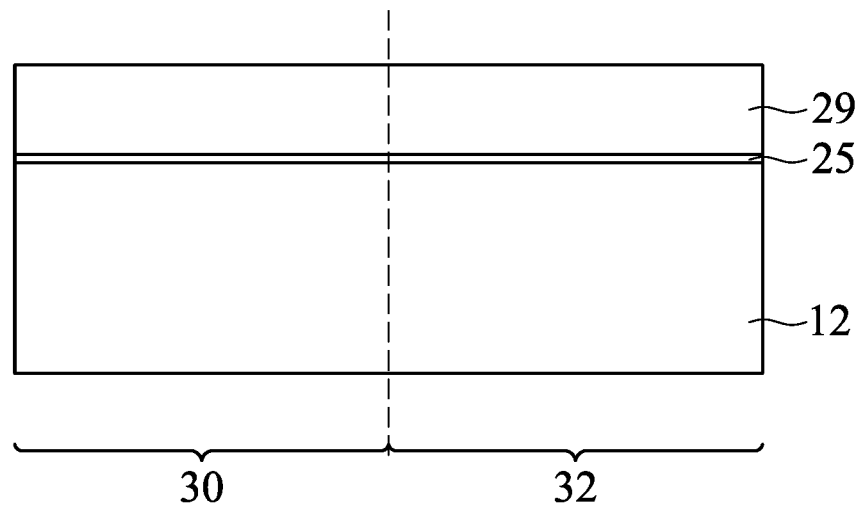
FIGS. 4A-4E are cross-sectional views of a method for fabricating a semiconductor structure in accordance with one embodiment of the invention.

As shown in FIG. 4A, a substrate 12 is provided. The substrate 12 comprises a first region 30 and a second region 32.

In accordance with some embodiments, the substrate 12 may be a silicon substrate.

In accordance with some embodiments, the first region 30 may be a region for disposition of a low-voltage device. The second region 32 may be a region for disposition of a high-voltage device.

Next, a silicon oxide layer 25 is formed on the substrate 12.

Next, a dielectric layer 29 is formed on the silicon oxide layer 25.

In accordance with some embodiments, the dielectric layer 29 may comprise silicon nitride or silicon oxide.

In this embodiment, the dielectric layer 29 is silicon nitride.

Figure 4B:
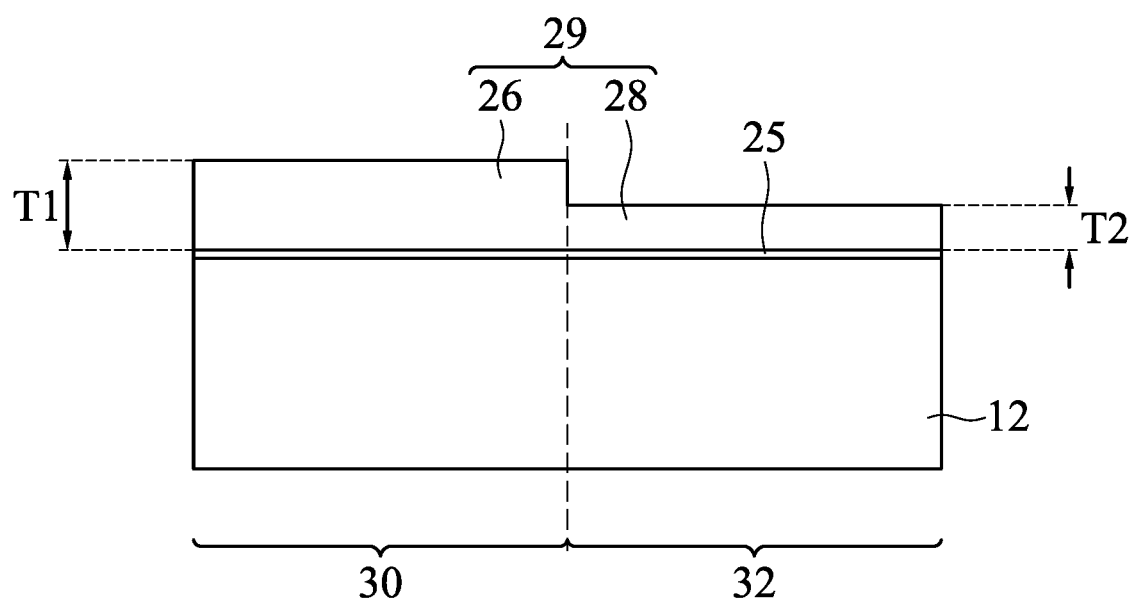

Next, the dielectric layer 29 is patterned to form a first dielectric layer 26 located within the first region 30 of the substrate 12 and a second dielectric layer 28 located within the second region 32 of the substrate 12. Specifically, the thickness T1 of the first dielectric layer 26 is larger than the thickness T2 of the second dielectric layer 28, as shown in FIG. 4B.

In accordance with some embodiments, the distinction between the thickness T1 of the first dielectric layer 26 and the thickness T2 of the second dielectric layer 28 is in a range from about 300 Å to about 1,000 Å.

Figure 4C:
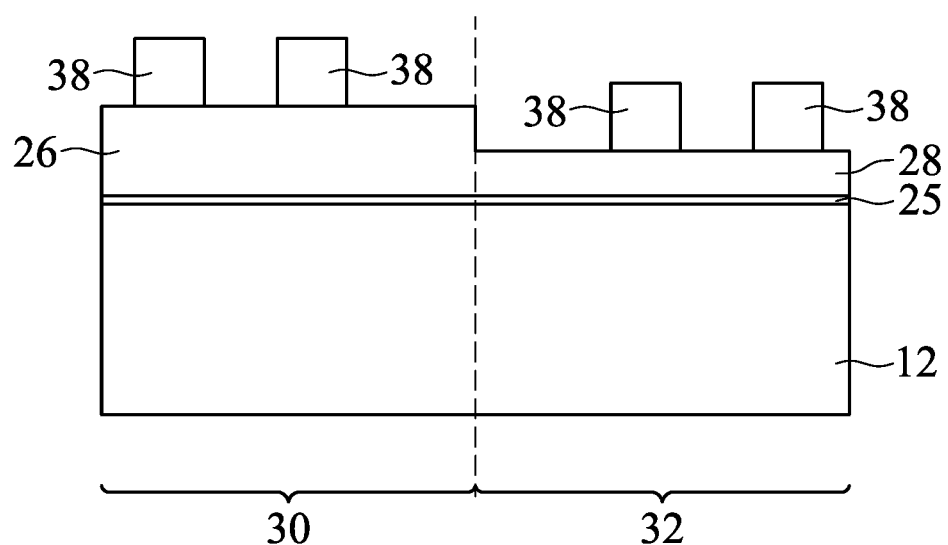

Next, a patterned photoresist layer 38 is formed on the first dielectric layer 26 and the second dielectric layer 28, as shown in FIG. 4C.

Figure 4D:
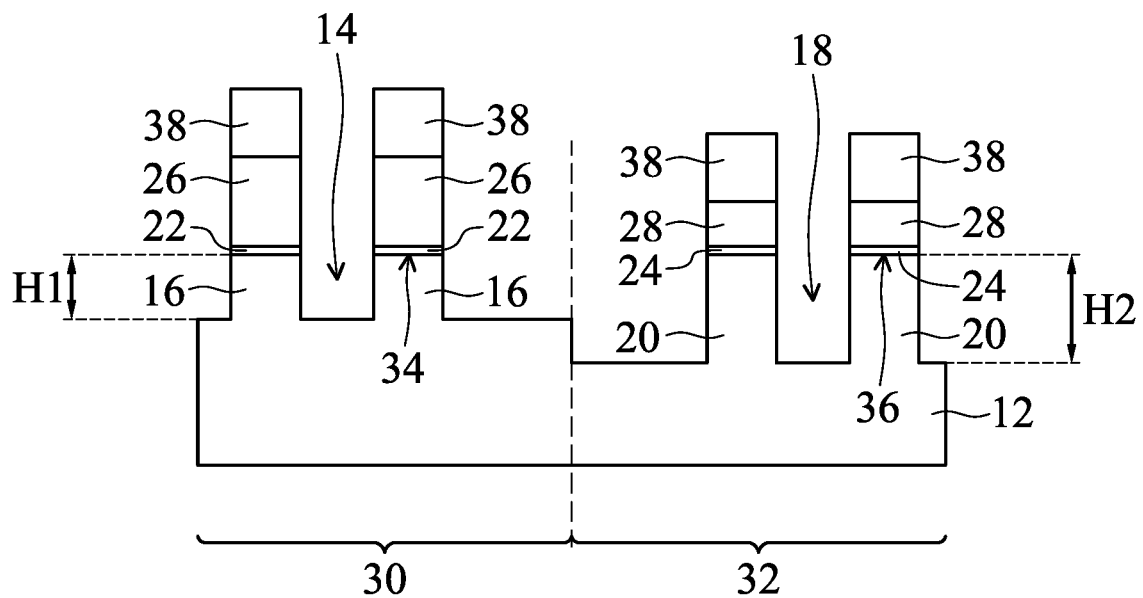

Next, an etching process is performed on the first dielectric layer 26, the second dielectric layer 28, the silicon oxide layer 25 and the substrate 12 using the patterned photoresist layer 38 as a mask to form a first trench 14 within the first region 30 of the substrate 12 and to form a second trench 18 within the second region 32 of the substrate 12. The first trench 14 is surrounded by a first protrusion structure 16. The second trench 18 is surrounded by a second protrusion structure 20. Specifically, the depth H2 of the second trench 18 is larger than the depth H1 of the first trench 14. The silicon oxide layer on the top portion 34 of the first protrusion structure 16 is defined as a first silicon oxide layer 22. The silicon oxide layer on the top portion 36 of the second protrusion structure 20 is defined as a second silicon oxide layer 24, as shown in FIG. 4D.

In accordance with some embodiments, etching gases used in the etching process may comprise a combination of sulfur hexafluoride, methane and nitrogen, or a combination of sulfur hexafluoride, methane, nitrogen and oxygen.

In accordance with some embodiments, etching selectivity ratios of the first dielectric layer 26 and the second dielectric layer 28 to the substrate 12 are in a range from about 1:4 to about 1:10.

In accordance with some embodiments, the first trench 14 may be an electrical isolation structure between low-voltage devices. The second trench 18 may be an electrical isolation structure between high-voltage devices.

In accordance with some embodiments, the distinction between the depth H1 of the first trench 14 and the depth H2 of the second trench 18 is in a range from about 500 Å to about 5,000 Å.

Next, the patterned photoresist layer 38 is removed.

Figure 4E:
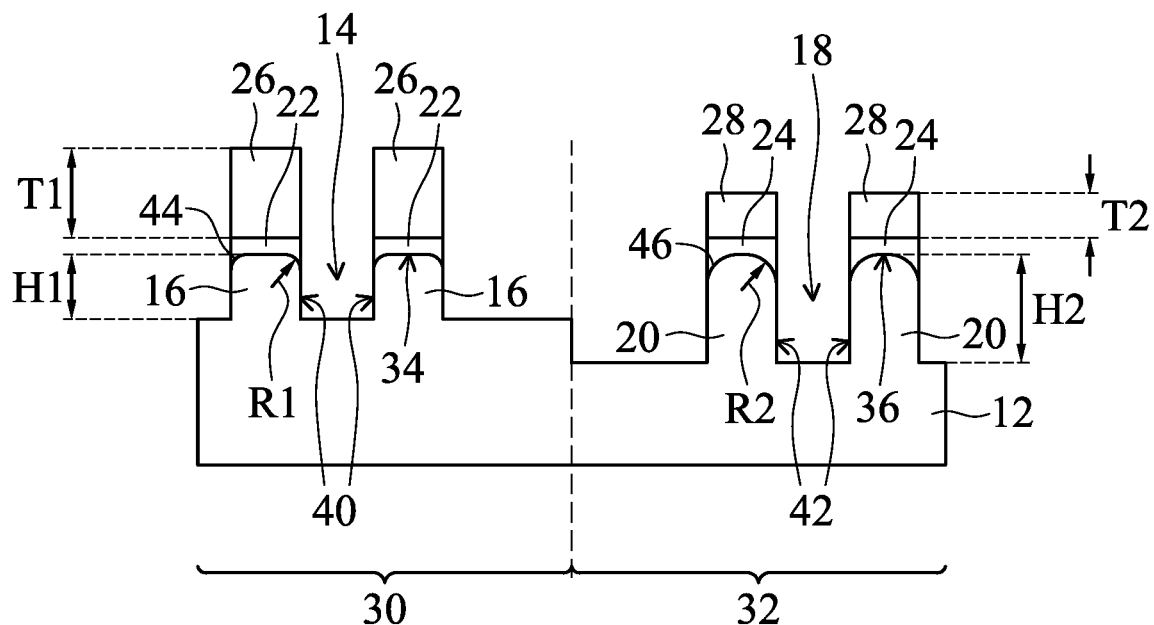

In this embodiment, an oxidation process is further performed to extend the first silicon oxide layer 22 to cover a portion of the sidewalls 40 of the first protrusion structure 16, and to extend the second silicon oxide layer 24 to cover a portion of the sidewalls 42 of the second protrusion structure 20. Specifically, the radius of curvature R2 of the connection portion 46 between the top portion 36 and the sidewalls 42 of the second protrusion structure 20 is larger than the radius of curvature R1 of the connection portion 44 between the top portion 34 and the sidewalls 40 of the first protrusion structure 16, as shown in FIG. 4E. Therefore, the fabrication of the semiconductor structure 10 of this embodiment is completed.

In the present invention, the silicon nitride layers having different thicknesses are fabricated, respectively, within the low-voltage region and the high-voltage region (i.e. the thick silicon nitride layer is formed within the low-voltage region and the thin silicon nitride layer is formed within the high-voltage region). The single etching step with the specific etching conditions (such as the specific etching selectivity ratio of the silicon nitride layer to the silicon substrate) is then performed to simultaneously obtain the shallow trench in the low-voltage region and the deep trench in the high-voltage region.

In addition, during the subsequent oxidation process (which can be performed before or after the chemical mechanical polishing (CMP) process), since the silicon nitride layer in the low-voltage region is thicker and the silicon nitride layer in the high-voltage region is thinner, the rounding effect of the trench in the low-voltage region is less, and the trench in the high-voltage region shows more rounding effects. This different degree of the rounding effect has different contributions to low-voltage devices and high-voltage devices, respectively. For the low-voltage devices, less rounding effect maintains the effective width of the device channel, resulting in a high saturation-region drain current (Idsat). For the high-voltage devices, more rounding effects improve the uniformity of the related structure in the whole wafer and increase the device matching.

Therefore, the present invention reveals that the trenches of different depths can be fabricated in the low-voltage region and the high-voltage region, while at the same time improving the structural and electrical advantages of the low-voltage devices and the high-voltage devices.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate comprising a first region and a second region;
   a first trench having a first depth and a bottom formed in the substrate within the first region, wherein the first trench is surrounded by a first protrusion structure having a top portion and sidewalls, and the first depth is defined from the top portion of the first protrusion structure to the bottom of the first trench; and
   a second trench having a second depth and a bottom formed in the substrate within the second region, wherein the second trench is surrounded by a second protrusion structure having a top portion and sidewalls, and the second depth is defined from the top portion of the second protrusion structure to the bottom of the second trench, wherein the second depth is larger than the first depth, and a connection portion between the top portion and the sidewalls of the second protrusion structure has a radius of curvature greater than that of a connection portion between the top portion and the sidewalls of the first protrusion structure.

2. The semiconductor structure as claimed in claim 1, wherein the substrate is a silicon substrate.

3. The semiconductor structure as claimed in claim 1, wherein the first region is a region for disposition of low-voltage devices, and the second region is a region for disposition of high-voltage devices.

4. The semiconductor structure as claimed in claim 3, wherein the first trench is an electrical isolation structure between the low-voltage devices, and the second trench is an electrical isolation structure between the high-voltage devices.

5. The semiconductor structure as claimed in claim 1, wherein the distinction between the depth of the first trench and the depth of the second trench is in a range from 500 Å to 5,000 Å.

6. The semiconductor structure as claimed in claim 1, further comprising a first silicon oxide layer formed on the top portion of the first protrusion structure, and a second silicon oxide layer formed on the top portion of the second protrusion structure.

7. The semiconductor structure as claimed in claim 6, further comprising a first dielectric layer formed on the first silicon oxide layer, and a second dielectric layer formed on the second silicon oxide layer, wherein the first dielectric layer has a thickness greater than that of the second dielectric layer.

8. The semiconductor structure as claimed in claim 7, wherein the first dielectric layer and the second dielectric layer comprise silicon nitride or silicon oxide.

9. The semiconductor structure as claimed in claim 8, wherein the first silicon oxide layer further extends to cover a portion of the sidewalls of the first protrusion structure, and the second silicon oxide layer further extends to cover a portion of the sidewalls of the second protrusion structure when the first dielectric layer and the second dielectric layer are silicon nitride.

10. The semiconductor structure as claimed in claim 7, wherein the distinction between the thickness of the first dielectric layer and the thickness of the second dielectric layer is in a range from 300 Å to 1.000 Å.

11. A method for fabricating a semiconductor structure, comprising:
   providing a substrate comprising a first region and a second region;
   forming a silicon oxide layer on the substrate;
   forming a dielectric layer on the silicon oxide layer, wherein the dielectric layer within the first region of the substrate has a greater thickness than the dielectric layer within the second region of the substrate; and
   performing an etching process on the dielectric layer, the silicon oxide layer and the substrate to form a first trench having a first depth and a bottom surrounded by a first protrusion structure having a top portion and sidewalls within the first region of the substrate, wherein the first depth is defined from the top portion of the first protrusion structure to the bottom of the first trench, and to form a second trench having a second depth and a bottom surrounded by a second protrusion structure having a top portion and sidewalls within the second region of the substrate, wherein the second depth is defined from the top portion of the second protrusion structure to the bottom of the second trench, wherein the second depth is larger than the first depth, and a connection portion between the top portion and the sidewalls of the second protrusion structure has a radius of curvature greater than that of a connection portion between the top portion and the sidewalls of the first protrusion structure, the silicon oxide layer on the top portion of the first protrusion structure is defined as a first silicon oxide layer, and the silicon oxide layer on the top portion of the second protrusion structure is defined as a second silicon oxide layer.

12. The method for fabricating the semiconductor structure as claimed in claim 11, wherein the distinction between a thickness of each of the dielectric layer within the first region of the substrate and that of the dielectric layer within the second region of the substrate is in a range from 300 Å to 1,000 Å.

13. The method for fabricating the semiconductor structure as claimed in claim 11, wherein the etching process has an etching gas comprising a combination of sulfur hexafluoride, methane and nitrogen, or a combination of sulfur hexafluoride, methane, nitrogen and oxygen.

14. The method for fabricating the semiconductor structure as claimed in claim 11, wherein the dielectric layer and the substrate have an etching selectivity ratio which is in a range from 1:4 to 1:10.

15. The method for fabricating the semiconductor structure as claimed in claim 11, wherein the distinction between the depths of the first and second trenches the first depth and the second depth is in a range from 500 Å to 5,000 Å.

16. The method for fabricating the semiconductor structure as claimed in claim 11, wherein the dielectric layer comprises silicon nitride or silicon oxide.

17. The method for fabricating the semiconductor structure as claimed in claim 16, further comprising: performing an oxidation process to extend the first silicon oxide layer to cover a portion of the sidewalls of the first protrusion structure, and to extend the second silicon oxide layer to cover a portion of the sidewalls of the second protrusion structure when the dielectric layer is silicon nitride.

* * * * *